(12) United States Patent
Iketsu et al.

(10) Patent No.: US 7,785,942 B2
(45) Date of Patent: Aug. 31, 2010

(54) ACTIVE MATRIX ORGANIC EL DISPLAY DEVICE AND MANUFACTURING METHOD THEREOF

(75) Inventors: Yuichi Iketsu, Tokyo (JP); Hironori Imura, Tokyo (JP)

(73) Assignee: NEC Corporation, Tokyo (JP)

( * ) Notice: Subject to any disclaimer, the term of this patent is extended or adjusted under 35 U.S.C. 154(b) by 108 days.

(21) Appl. No.: 12/175,530

(22) Filed: Jul. 18, 2008

(65) Prior Publication Data

US 2009/0053862 A1 Feb. 26, 2009

Related U.S. Application Data

(62) Division of application No. 10/522,156, filed as application No. PCT/JP03/08835 on Jul. 11, 2003, now Pat. No. 7,417,251.

(30) Foreign Application Priority Data

Jul. 24, 2002 (JP) .............................. 2002-215476

(51) Int. Cl.
*H01L 21/84* (2006.01)
*H01J 5/48* (2006.01)

(52) U.S. Cl. .............................. 438/155; 313/51; 349/69

(58) Field of Classification Search ................... 349/69; 438/155

See application file for complete search history.

(56) References Cited

U.S. PATENT DOCUMENTS 6,690,034 B2  2/2004  Fujimoto et al.
6,940,214 B1 *  9/2005  Komiya et al. ................ 313/51
7,211,838 B2  5/2007  Miyazawa
2001/0036691 A1 * 11/2001  Kitazume et al. ........... 438/160
2002/0196389 A1 * 12/2002  Koyama ....................... 349/69
2003/0003225 A1 *  1/2003  Choi et al. .................... 427/66

FOREIGN PATENT DOCUMENTS

| JP | 2-150823 | 6/1990 |
| JP | 4-366819 | 12/1992 |
| JP | 8-184857 | 7/1996 |
| JP | 11-24604 | 1/1999 |
| JP | 2000-231346 | 8/2000 |
| JP | 2001-318628 | 11/2001 |

OTHER PUBLICATIONS

US 7,355,205, 04/2008, Yamazaki et al. (withdrawn)

* cited by examiner

*Primary Examiner*—Kiesha R Bryant
*Assistant Examiner*—Antonio B Crite
(74) *Attorney, Agent, or Firm*—Young & Thompson

(57) ABSTRACT

An active matrix organic EL display device includes pixels each having an organic EL element (7*a*) and a pixel circuit (3) including a polysilicon TFT for controlling the organic EL element (7*a*) arranged adjacently in each of the regions partitioned into a matrix shape by data line (12) and gate line (11) that intersect each other. The organic EL element (7*a*) has a cathode (7) arranged in at least a region that excludes a space above the polysilicon TFT. The cathode (7) is arranged continuously over two or more adjacent pixels in the direction of gate line (11).

3 Claims, 9 Drawing Sheets

Source-side drive circuit

PRIOR ART

PRIOR ART

PRIOR ART

PRIOR ART

Gate voltage

PRIOR ART

ACTIVE MATRIX ORGANIC EL DISPLAY DEVICE AND MANUFACTURING METHOD THEREOF

TECHNICAL FIELD

The present invention relates to an Organic Electro Luminescence (EL) display device and a manufacturing method thereof, and in particular, to an active matrix organic electro luminescence display device using a polysilicon Thin Film Transistor (TFT) as an active device and a manufacturing method thereof.

BACKGROUND ART

Liquid crystal display devices have generally been used for conventional low-profile and light-weight flat-panel displays. The liquid crystal display device has, however, a problem in that it has a smaller angle of field and poor response characteristics because it controls the transmitted light with the orientation direction of the liquid crystal. Active matrix organic EL display devices have recently attracted attention which have a large angle of field and high response characteristics. The organic EL element is a self-light-emitting element based on the principle in which the electric field applied can bring the holes injected from the anode and the electrons injected from the cathode into recombination, the energy of which can allow the fluorescent substance to emit light, thereby providing good visibility. The organic EL element also needs lower power consumption because no backlight source is used, so that it is expected to become the alternative display device, particularly in hand-held device equipment such as cellular phones.

The active matrix organic EL display device needs to increase the light-emitting efficiency of the organic EL element itself by improving the injection efficiency of the holes in the light-emitting layer in the laminated structure such as the hole injection layer/hole-transport layer/light-emitting layer/electron-transport layer, and by improving the generation efficiency of excitons generated in the recombination and the like. In order to improve the display quality in the active matrix organic EL display device, the characteristic of the TFT needs to be improved, such as the circuit response and the like.

In the above-mentioned TFT, amorphous silicon TFT that uses amorphous silicon layer has mainly been used. The requirements for better TFT characteristics, however, have recently led to the development of TFT using the polysilicon layer (hereinafter abbreviated as polysilicon TFT) with higher electric field mobility than the amorphous silicon layer. The manufacture of polysilicon TFT requires a process for the crystallization of the amorphous silicon layer. Such a process includes a high-temperature process for crystallization at a temperature of about 600° C. using an electric heating furnace, and a low-temperature process for crystallization at a low temperature of about 300° C. or less using laser or infrared light.

High-temperature process has the advantages that the LSI (Large Scale Integration) technology can be used to form a thermally-oxidized gate insulating layer and the TFT characteristic variation can be prevented because interface properties between the thermally-oxidized gate insulating layer and the polysilicon are stabilized. The high-temperature process, however, needs higher temperatures during the process of crystallization process, so that it cannot apply to display devices that use a substrate such as glass or plastic. The low-temperature process for crystallization using laser annealing or lamp annealing has thus usually been used for active matrix organic EL display device.

A description is given below of an active matrix organic EL display device with a polysilicon TFT made by the above-described low-temperature process (hereinafter referred to as a low temperature polysilicon TFT). FIG. 1A schematically shows a plan view of the structure of the conventional active matrix organic EL display device described in Japanese application patent laid-open publication No. 2001-318628. FIG. 1B shows a cross sectional view taken along the line B-B' in FIG. 1A. FIG. 2A to FIG. 2E, FIG. 3A to FIG. 3D, and FIG. 4A to FIG. 4C show process cross sectional views of a series of manufacturing procedures for the active matrix substrate. FIG. 5 shows an equivalent circuit diagram of the active matrix organic EL display device.

Referring first to FIG. 2A to FIG. 4C, a description is given of the manufacturing process of the active matrix substrate described in the above-described reference. First, primary layer 101 is formed on glass substrate 100. Amorphous silicon is then deposited, and polysilicon layer 102 is formed using laser annealing or lamp annealing or the like (see FIG. 2A). Next, on polysilicon layer 102 is formed protective layer 103 of a silicon oxide layer, on which is formed resist mask 104. Using resist mask 104, n-type impurities such as phosphorous or arsenic are added to form n-type impurity region 105. The added impurities are then activated using laser annealing or the like (see FIG. 2B and FIG. 2C). Next, polysilicon layer 102 is locally removed to form island-shaped active layers 106 to 109. Then, after gate insulating layer 110 has been formed, gate electrodes 111 to 114, source wiring 115, and current-supply line 116 are formed (see FIG. 2D and FIG. 2E).

Next, using gate electrodes 111 to 114 as masks, n-type impurities such as phosphorous are doped in a self-alignment manner to form impurity regions 117 to 124. Then, using resist mask 125, n-type impurities such as phosphorous are locally added to form impurity regions 126 to 130 including a high concentration of phosphorous (see FIG. 3A and FIG. 3B). Next, using resist mask 131, p-type impurities such as boron are locally doped to form impurity regions 132 to 135 including a high concentration of boron (see FIG. 3C). Then, resist mask 131 is removed to provide a circuit element such as polysilicon TFTs (see FIG. 3D).

Next, first interlayer insulating layer 136 is formed on the circuit element including polysilicon TFTs, and the impurity element is activated with laser annealing or lamp annealing. Then, second interlayer insulating layer 137 is formed. Contact holes are then formed through first interlayer insulating layer 136, second interlayer insulating layer 137, and gate insulating layer 110, down to the impurity region. Then, metal is filled in each contact hole and patterned to form wirings 138 to 145. Then pixel electrode 146 is formed in contact with connection electrode 141 (see FIG. 4A and FIG. 4B).

The above-mentioned processes in FIG. 2A to FIG. 4B are the same as the low temperature polysilicon TFT manufacturing technology that is used in active matrix liquid crystal display devices and the like. The above-mentioned processes can be achieved by applying technologies such as polysilicon formation technology for forming polysilicon by forming and annealing the amorphous silicon layer, impurity implantation technology for forming n-type TFT and p-type TFT, conductive layer formation technology such as Al and insulating layer formation technology for layers of silicon oxide and silicon nitride, resist layer formation technology for defining these layer-formed regions and implanted regions, and etching technology for removing regions that need no formed layer.

After pixel electrode 146 is formed, third interlayer insulating layer 147 is formed as shown in FIG. 4C. The laminated structure included in the organic EL element except for the anode and cathode has a thickness as thin as about 80 nm to 200 nm, and the cathode has a thickness as thin as about 30 nm to 300 nm, so that steep shapes are covered before forming the organic EL element to prevent cracks from forming at the step edges, and edges are tapered to prevent cracks at the edge steps. After the third interlayer insulating layer 147 is formed in a tapered shape, organic EL layer 148 is formed with vapor deposition technology in the desired region in each pixel, and then, cathode 149 and protective electrode 150 are formed. Finally, passivation layer 151 is formed to protect organic EL layer 148, thereby providing the active matrix organic EL display device.

As shown in the equivalent circuit in FIG. 5, the active matrix organic EL display device formed in the above-described manner has a pixel enclosed by gate wiring 145 disposed in a row direction, and source wiring 115 and current-supply line 116 disposed in a column direction. The pixel contains switching TFT 202 connected to gate wiring 145 and source wiring 115, light-emitting element 204 including organic EL layer 148 sandwiched between pixel electrode (anode) 146 and cathode 149 (see FIG. 4C), and controlling TFT 203 including source and drain; one is connected via holding capacitance 207 to the drain of switching TFT 202, and the other is connected to the anode of light-emitting element 204. Cathode 149 of light-emitting element 204 is common to all pixels. In this way, the cathode electrode may be a single electrode structure across the entire display region, because wiring lines from the row and column drivers can select the address for each pixel, so that cathode 149 is only a power supply electrode.

As shown in FIG. 1A, on substrate 4001, the pixels represented in the above-described equivalent circuit are arranged in a matrix to form pixel portion 4002, and gate-side drive circuit 4004 and source-side drive circuit 4003 are disposed along the ends in a row direction and a column direction. The above components are then sealed with first sealing material 4101 and second sealing material 4104. Wiring 4005 as a lead is formed during the sealing, and one end of FPC (flexible print circuit) 4006 is connected to this wiring 4005. In the organic EL display device thus obtained, as seen from FIG. 1B which shows the cross section taken along the line B-B, in FIG. 1A (a connection with the outside, a part of source-side drive circuit 4003, and a cross section of one pixel of pixel portion 4002), and as seen from FIG. 4C, the cathode electrode (which corresponds to cathode 149 and protective electrode 150 in FIG. 4C, and cathode 4305 in FIG. 1B) is formed across the entire display region where pixels are arranged in a matrix, and thus also formed over pixel circuits including polysilicon TFTs, and over wiring lines connecting the row and column drivers to the pixel circuit.

There are two problems as follows with respect to the structure of the conventional active matrix organic EL display device in which the cathode electrode that constitutes a part of the organic EL elements is formed across the entire display region as a single electrode.

The first problem is that because the cathode electrode is formed across the entire display region and thus also formed over wiring lines connecting the row and column drivers to the pixel circuits, capacitance arises between this wiring line and the cathode electrode, which delays the signals traveling on the wiring line. Such delayed signals may limit the frame frequency, which makes it difficult to provide an active matrix organic EL display device that is adaptable to high-speed moving video pictures. Sending signals to the wiring line that has the above-described capacitance is also disadvantageous in terms of power consumption and may prevent lower power consumption from being achieved.

The second problem is that in the vapor deposition process for forming the cathode electrode, the electron beam vapor deposition source cannot be used as a vapor deposition source. This problem is described more specifically below.

The vapor deposition process is a technology that heats and evaporates materials that are to be coated in a vacuum and deposits them on a substrate. While there are many methods for heating the materials to be coated, the electron beam vapor deposition source is often used for general mass production. This is because, compared to other vapor deposition sources, the electron beam vapor deposition source has a more stable evaporation angle for the materials to be coated which can provide a higher quality vapor deposition layer, and it provides less sprats and more uniform layers, and allows for easier filling of the materials to be coated, and needs less maintenance, which can increase the capacity utilization of the film formation facility.

It has become apparent, however, that when the cathode electrode of the conventional active matrix organic EL display device is formed with the vapor deposition system including the electron beam vapor deposition source, the cathode electrode is formed across the entire display region and thus also formed over the polysilicon TFTs, so that the characteristic X-ray emerging from the electron beam vapor deposition source may degrade the polysilicon TFT characteristics, by changing the threshold voltage Vt, increasing the leak current, decreasing the on-state current and the like.

FIG. 6 shows experimental results of the characteristic change of polysilicon TFTs which are irradiated with X-ray. In FIG. 6, the x-axis shows the gate voltage, and the y-axis shows the drain current. As seen in FIG. 6, X-ray exposure can shift the polysilicon TFT characteristics to the more negative value (to the left in the drawing) for both the pch-TFT and nch-TFT. This gate voltage shift may prevent the normal TFT operation, and make it impossible to realize a high image quality display device without lines or non-uniformity on the screen.

The above-described gate voltage variation of the polysilicon TFTs may arise from the trap levels generated in the gate insulating layer of the polysilicon TFTs. Each of the TFTs arranged in matrix, in conventional polysilicon TFT, particularly the polysilicon TFT made with the low-temperature process, however, lacks sufficient characteristics and uniformity, which makes it impossible to demonstrate the effect of the characteristic X-ray. The inventors of the present invention have demonstrated the effect of the characteristic X-ray by improving the low temperature polysilicon TFT manufacturing technology to make it possible to manufacture the polysilicon TFT with good characteristics and good uniformity thereof. The novel fact that the inventors of the present invention have found is the detailed relationship between the characteristics X-ray from the electron beam vapor deposition and the gate voltage variation of the low temperature polysilicon TFT.

As described above, the conventional active matrix organic EL display device has a cathode electrode that is formed across the entire display region and thus also formed over the wiring lines connecting the row and column drivers to the pixel circuit and over the polysilicon TFTs. This may cause a signal delay problem due to capacitance arising between the wiring lines and cathode electrode, and the polysilicon TFT characteristic degradation problem due to the characteristic X-ray that are generated during the electron beam vapor deposition, thus making it impossible to realize a high-speed-response and high-quality display device.

The present invention was realized in light of the above-described problems, and aims mainly to provide an active matrix organic EL display device and a manufacturing method thereof which can prevent, without complexing the manufacturing process, the display quality decrease caused by the signal delay that occurs due to the capacitance between the wiring lines and cathode electrode and the polysilicon TFT characteristic degradation.

DISCLOSURE OF INVENTION

To realize the above-described object, the active matrix organic EL display device according to the present invention is an active matrix organic EL display device including a pixel that has an organic EL element and a polysilicon TFT for controlling the organic EL element which are disposed adjacent to each other, the pixel being formed in each of the regions partitioned into a matrix by a plurality of intersecting data lines and scanning lines, wherein the organic EL element has a cathode electrode provided in at least a region excluding a region over said polysilicon TFTs.

In the above-described device, the cathode electrode may be provided continuously over two or more adjacent pixels in a direction of the data line or scanning line.

The organic EL element may include a light-emitting region, and the cathode electrode may be formed to enclose or to cover the light-emitting regions of the two or more adjacent pixels.

The cathode electrode may be provided in a region which excludes the region over the polysilicon TFT and excludes a region over one wiring line of the data line and scanning line that partitions the pixel regions.

In addition, the cathode electrode may be provided continuously over two or more adjacent pixels in the direction of the one of said wiring lines.

In addition, the organic EL element may include a light-emitting region, and the cathode electrode may be formed to enclose or cover the light-emitting regions of the two or more adjacent pixels.

Another active matrix organic EL display device according to the present invention is an active matrix organic EL display device including a pixel that has an organic EL element, the pixel being formed in each of the regions that are partitioned into a matrix by a plurality of intersecting data lines and scanning lines, wherein the organic EL element has a cathode electrode which is provided in at least a region excluding a region over one wiring line of the data line and scanning line partitioning the pixel regions and provided continuously over two or more adjacent pixels in the direction of the one wiring line.

In the above-described device, the organic EL element may include a light-emitting region, and the cathode electrode may be formed to enclose or cover the light-emitting regions of the two or more adjacent pixels.

In any one of the above-mentioned inventions, the area between opposite edges of the region where the cathode electrode is formed and the region where the polysilicon TFT is formed may be 20 μm or more.

The area between opposite edges of the region where the cathode electrode is formed and the region where the one wiring line is formed may be 20 μm or more.

In addition, the cathode electrode that is provided continuously over two or more adjacent pixels may be formed in a strip, the active matrix organic EL display device may further include at least one cathode electrode wiring which extends in the direction of the narrow area of the cathode electrode, and the cathode electrodes in strips may be arranged along the cathode electrode wiring and each of the cathode electrodes may be connected to the cathode electrode wiring.

In addition, the cathode electrode may comprise a vapor deposition layer including lithium or a lithium compound and aluminum.

A method for manufacturing an active matrix organic EL display device according to the present invention is a method for manufacturing an active matrix organic EL display device including a pixel that has an organic EL element and a polysilicon TFT for controlling the organic EL element which are disposed adjacent to each other, the pixel being formed in each of the regions that are partitioned into a matrix by a plurality of intersecting data and scanning lines, comprising the step of forming the polysilicon TFT on a substrate, and forming a cathode electrode of the organic EL element on the substrate with electron beam vapor deposition using a vapor deposition mask covering at least a region where the polysilicon TFT is formed.

In the above-described method, the cathode electrode may be formed in a strip to be provided continuously over two or more adjacent pixels in the direction of the data line or scanning line.

The organic EL element may include a light-emitting region, and the cathode electrode may be formed to enclose or cover the light-emitting regions of the two or more adjacent pixels.

In addition, before forming the polysilicon TFT, at least one cathode electrode wiring which extends in the direction of the narrow area of the cathode electrode may be formed on the substrate, and in forming the cathode electrode in a strip, each of the cathode electrodes formed in strips may be connected to the cathode electrode wiring through contact holes.

The cathode electrodes may be formed with material including lithium or a lithium compound and aluminum.

In the above-described active matrix organic EL display device and manufacturing method thereof according to the present invention, the cathode electrode is not formed over the polysilicon-TFT-formed region included in the pixel circuit. This configuration can protect the polysilicon TFT via the vapor deposition mask in the vapor deposition process to prevent the polysilicon TFT characteristic degradation due to the X-ray. This allows use of the electron beam vapor deposition system in high mass production capability to realize high image quality display devices without lines or nonuniformity on the screen, having control circuits comprised of polysilicon TFTs that have less characteristic variation and perform according to design specification.

In the present invention, the cathode electrode formed by the vapor deposition process is not formed over the wiring lines (data line and scanning line) that connects the row driver and column driver to the pixel circuits. This configuration can reduce the capacitance between the wiring lines and cathode electrodes so that the driver can operate at lower power and high-speed. This allows a higher frame frequency and thus enables a display device that has less flicker and is adaptable to the high-speed animation.

BEST MODE FOR CARRYING OUT THE INVENTION

The preferred embodiments of the present invention will now be described in more detail below with reference to the accompanying drawings.

The active matrix organic EL display device according to one embodiment of the present invention includes, on a glass substrate, organic EL elements arranged in a matrix, pixel circuits including polysilicon TFT for controlling each organic EL element, and a row driver and a column driver for controlling the pixel circuits, wherein cathode electrodes are formed, using the vapor deposition mask having a metal plate with an opening formed thereon and the electron beam vapor deposition source, in regions which exclude regions over the polysilicon TFTs or regions over the polysilicon TFTs and scanning line wirings, to enclose the light-emitting portions of two or more successive pixels in the scanning line wiring direction. The cathode electrodes are not formed over the wiring lines which connect the row drivers or column drivers to the pixel circuits and the scanning line wirings in order to reduce the capacitance between the wiring line and cathode electrode, and the vapor deposition mask covers the polysilicon TFTs while forming the cathode electrode so as to make it possible to prevent the TFT characteristic degradation due to the X-ray from the electron beam vapor deposition source.

Embodiments of the present invention will be described in detail below with reference to examples 1 and 2.

Example 1

Figure 7A:
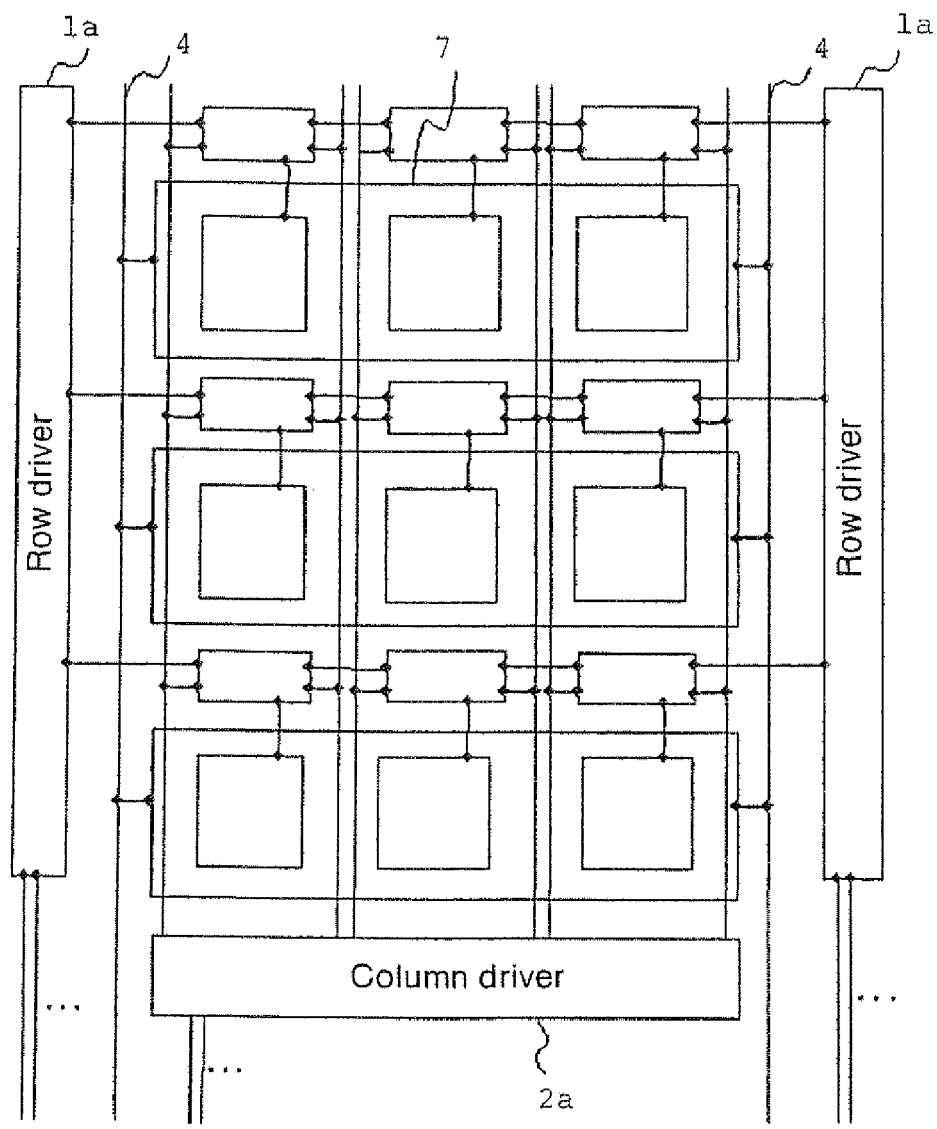
FIG. 7A schematically shows a block diagram of the configuration of the active matrix organic EL display device according to the first example of the present invention.
Figure 7B:
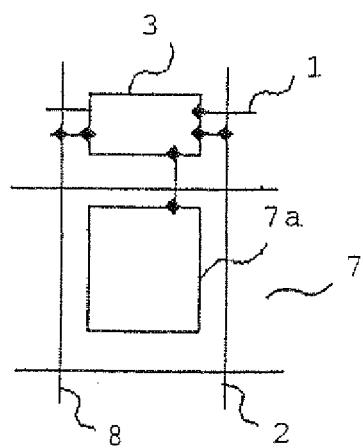
FIG. 7B shows the configuration of one pixel of the active matrix organic EL display device shown in FIG. 7A.
Figure 8:
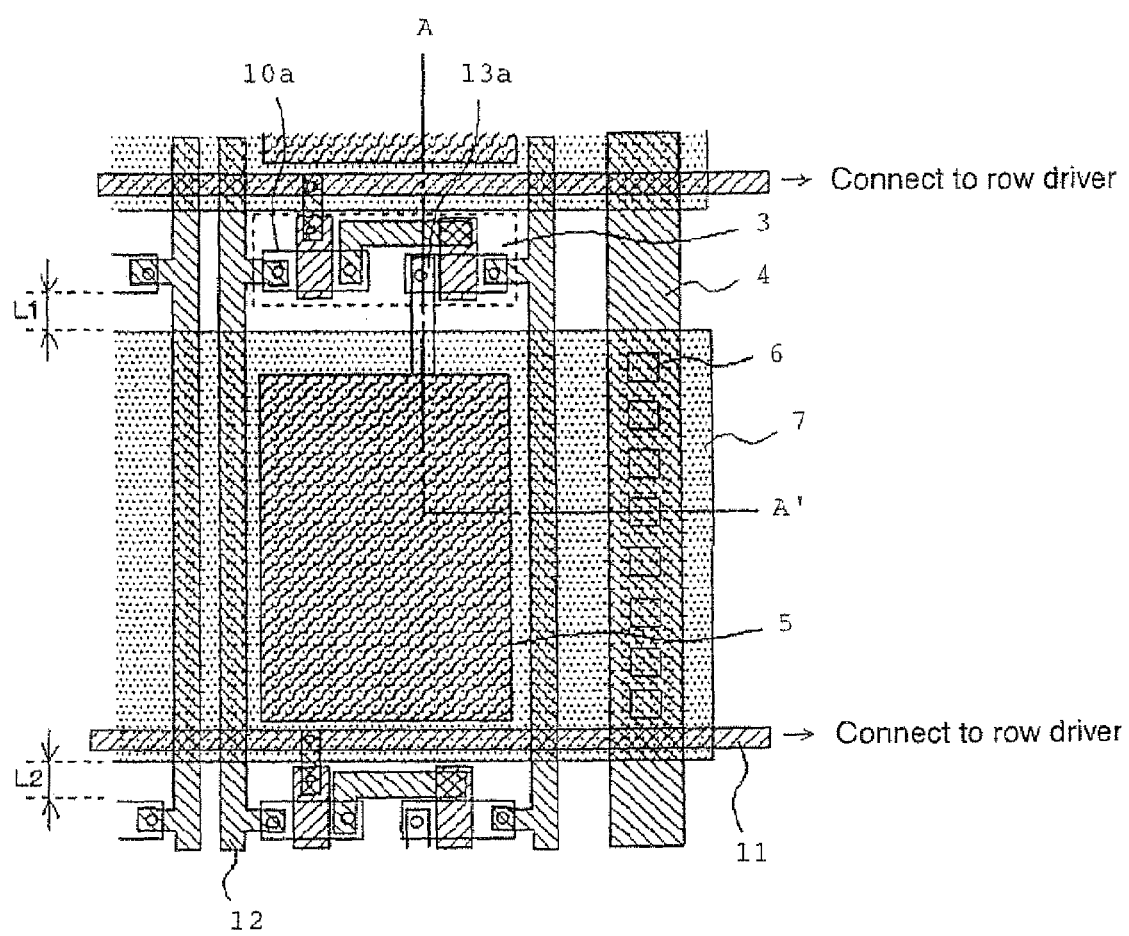
FIG. 8 shows a plan view of the structure of the active matrix organic EL display device according to the first example of the present invention.
Figure 9A:
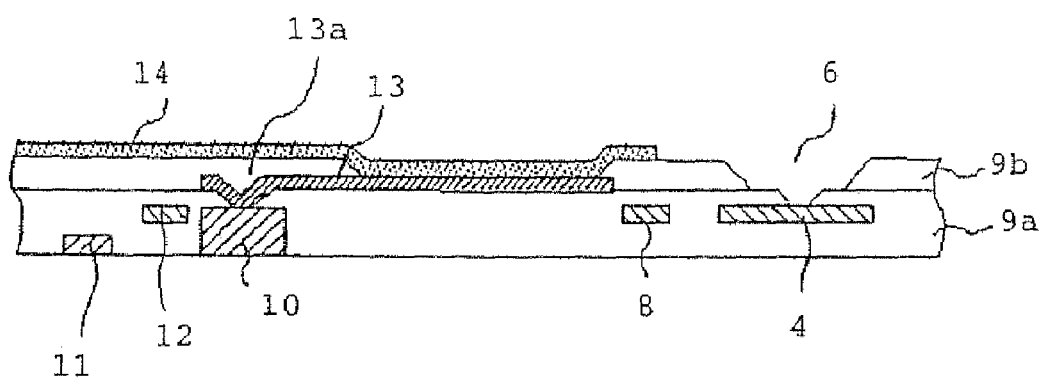
FIGS. 9A and 9B show cross sectional views of portions of the manufacturing process of the active matrix organic EL display device according to the first example of the present invention.
Figure 9B:
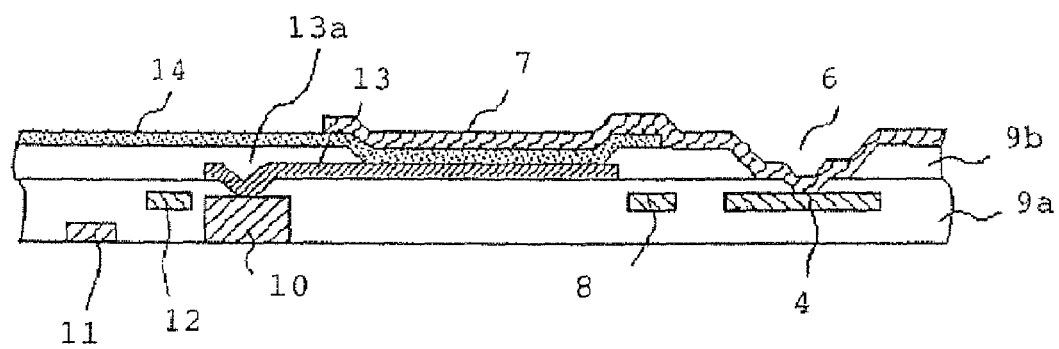

A description is given of the configuration and the manufacturing method of the active matrix organic EL display device according to the first example of the present invention. FIG. 7A shows the configuration of the active matrix organic EL display device according to the first example of the present invention and is a block diagram that includes the entire display region. FIG. 7B shows a partial enlarged view of one pixel (sub-pixel) in FIG. 7A. FIG. 8 shows a plan view of the structure of the active matrix organic EL display device according to the first example of the present invention, and FIG. 9A and FIG. 9B illustrate portions of the manufacturing process thereof and are cross sectional views taken along the line A-A' in FIG. 8.

In the following account, the description is omitted to simplify the explanation of items such as a sealing structure for preventing degradation of the organic EL element and the manufacturing process related to the sealing, an electrical connection structure including FPC (flexible print circuit) which connects the glass substrate (hereinafter referred to as a display substrate) including the polysilicon TFTs and organic EL elements to the external power supply, and the manufacturing process thereof, and a circuit for supplying power and inputting signals to the display substrate.

As shown in FIGS. 7A and 7B, the active matrix organic EL display device in this example has organic EL element 7a formed in each sub-pixel which corresponds to each of the RGB primaries included in one pixel. Organic EL elements 7a are arranged in a transversal (row) direction and have a rectangular shape in the up-down direction of the drawing figure. As shown, each sub-pixel includes organic EL element 7a over which pixel circuit 3 is provided for controlling organic EL element 7a. The pixels as configured above are arranged in a matrix to form a display region, which has row drivers 1a disposed on its right and left sides for selecting rows. The display region has thereunder column driver 2a for controlling the brightness of each sub-pixel. Row driver 1a and column driver 2a select a pixel and the selected pixels each emits light with controlled brightness to act as the display.

Each sub-pixel has cathode electrode 7 for the organic EL element which is formed independently for each row. As shown in FIG. 8, cathode electrode 7 is not formed over pixel circuit 3 including polysilicon-formed region 10a, but is formed over organic EL element light-emitting regions 5 which are included in each of two or more successive pixels in the wiring direction of row driver 1a, and over the wiring of column driver 2a disposed between light-emitting regions 5. Cathode electrode 7 is electrically connected through contact hole 6 on cathode electrode wiring 4 between the display region and row-driver-formed region. The wiring line from row driver 1a to pixel circuit 3 and cathode electrode wiring 7 include multilevel interconnection structures which are certainly electrically independent.

Structures shown in FIGS. 7A, 7B, and 8 are examples, and arrangements such as for organic EL element light-emitting region 5 and pixel circuit 3 in each pixel, sub-pixels for the RGB primaries, row driver 1a, column driver 2a, and cathode electrode wiring 4, can be optionally set for different designs. Cathode electrode 7 and cathode electrode wiring 4 may be connected on one side or two opposite sides of each of the pixels (i.e., three adjacent sub-pixels).

Referring now to process cross sectional views in FIGS. 8, 9A, and 9B, a description is made of the manufacturing process for the active matrix organic EL display device as configured above.

As shown in FIG. 9A, the display substrate of the active matrix organic EL display device of this example has thereon pixel circuit 3 including polysilicon TFTs formed with the low temperature polysilicon TFT manufacturing technology and other elements, and various wiring lines such as gate line 11, data line 12, power supply line 8, and cathode electrode wiring 4.

Pixel circuit 3 can be formed with polysilicon layer formation technology in which the amorphous silicon is crystallized with laser or lamp annealing, and deposition, patterning, and etching technologies which are well known in semiconductor manufacturing technology, and other technologies. More specifically, pixel circuit 3 is formed as follows. First, an insulating layer such as silicon oxide layer is formed on a translucent substrate such as glass with CVD, on which amorphous silicon is deposited. Subsequently, impurity doping and polysilicon-forming processes such as laser annealing are performed. Then, resist coating, exposure and etching processes are performed in order to form polysilicon 10 in the TFT-formed region. Next, the gate insulating layer including layers such as the silicon oxide layer, and WSi (tungsten silicide) and the like are sequentially deposited, PR (photoresist) coating and etching are also performed in order to form the gate electrode and gate wiring 11, and then the impurity doping is performed in order to form the polysilicon TFT. Then, CVD is used to deposit an interlayer insulating layer including a silicon oxide layer, and PR coating and etching are performed to form contact holes, on which Al and the like are deposited, PR coating and etching are performed to form source/drain electrodes, data line 12, power supply line 8, cathode electrode wiring 4 and the like.

Figure 1A:
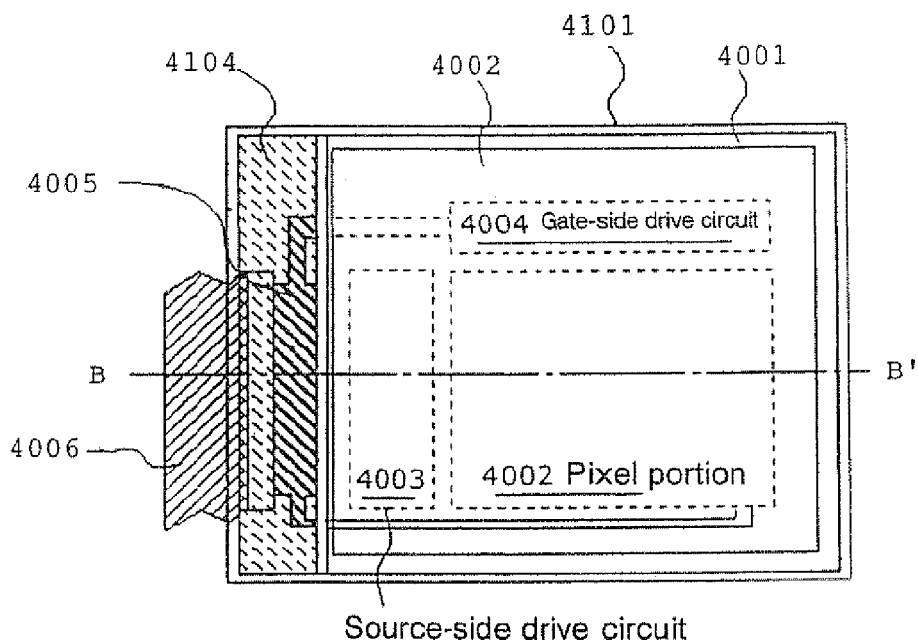
FIG. 1A shows a plan view of the structure of the conventional active matrix organic EL display device.
Figure 1B:
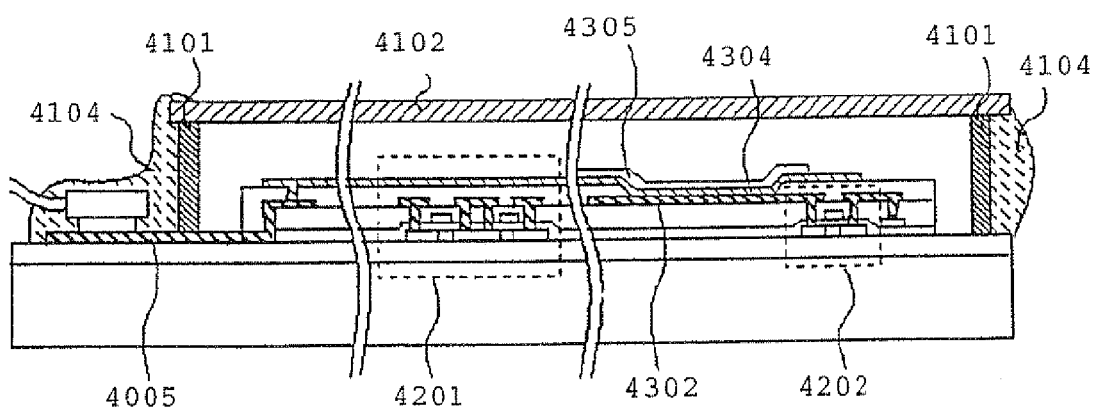
FIG. 1B shows a cross sectional view taken along the line B-B' in FIG. 1A.
Figure 2A:
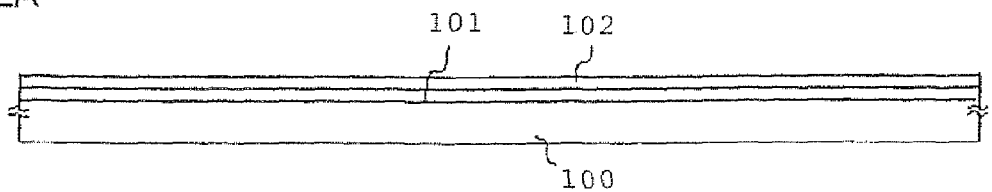
FIG. 2A to FIG. 2E show cross sectional views of manufacturing procedures for the conventional active matrix organic EL display devices.
Figure 2B:
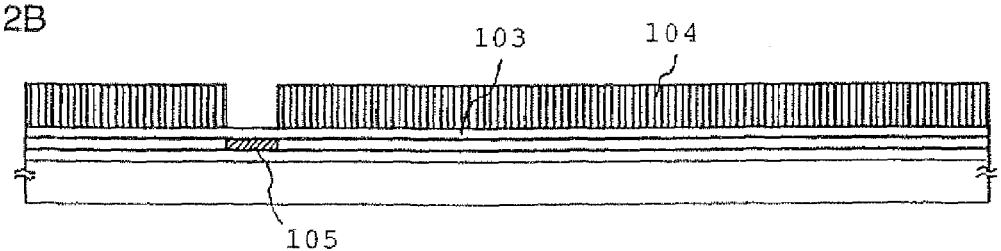
Figure 2C:
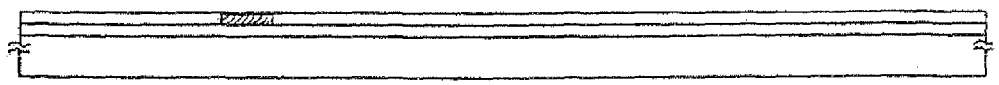
Figure 2D:
Figure 2E:
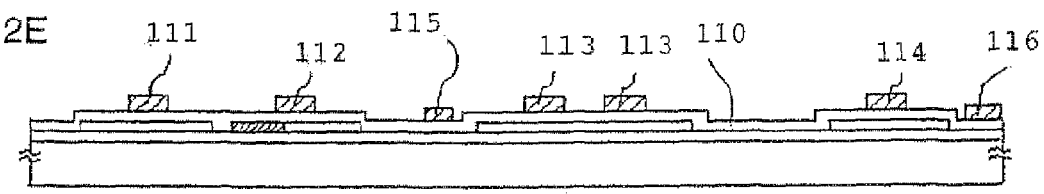
Figure 3A:
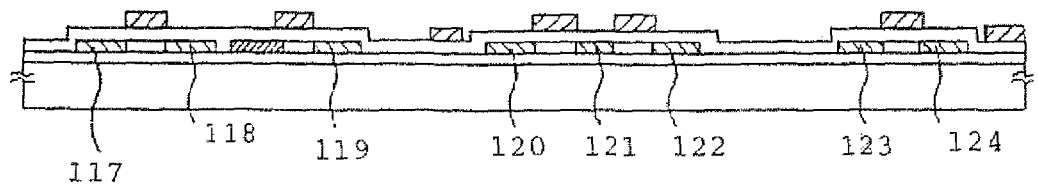
FIG. 3A to FIG. 3D show cross sectional views of manufacturing procedures for the conventional active matrix organic EL display devices.
Figure 3B:
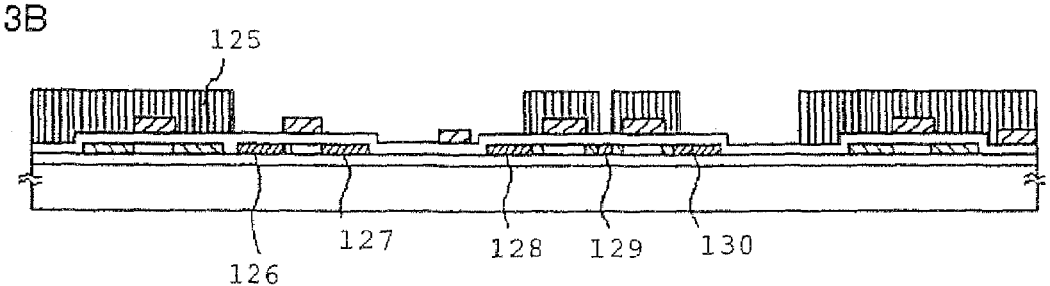
Figure 3C:
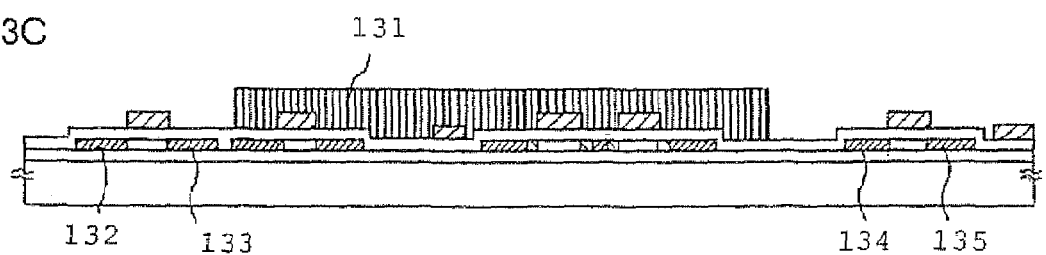
Figure 3D:

Before forming polysilicon TFT on the substrate, WSi and metal and the like may be deposited as an underlying layer of the TFT-formed region to form a light blocking layer. In the structure example shown in FIG. 9A, gate line (scanning line) 11 and wiring lines such as data line 12 and cathode electrode wiring 4 are laminated via the interlayer insulating layer (insulating layer 9a). Alternatively, as with the conventional technologies shown in FIGS. 1 and 2, these wiring lines may be formed on the same layer and the intersections may be connected with bridges.

In this way, the polysilicon TFTs and various wiring lines are formed on the substrate, on which the ITO (Indium-Tin Oxide) electrode for anode 13 of each organic EL element 7a is formed, then insulating layer 9b, in which organic EL element light-emitting region 5 is opened and edges of the opening are tapered, is formed with oxide layer formation technology such as CVD and isotropic etching technology, or edge-rounding technology in which the photosensitive resist is cured. In this example, cathode electrode 7 is separately formed for each pixel, so that contact holes 6 are formed at the same time for connecting each cathode electrode 7 with cathode electrode wiring 4. The edge of this contact hole 6 is also tapered to prevent cracks in cathode electrode 7 from forming at the step edges. Then, the hole-injection layer, hole-transport layer, light-emitting layer, and electron-transport layer, which are known as the organic EL element structure, are serially formed by vapor deposition technology and the like to create organic layer 14. This organic layer 14 may be any structure of the hole-transport layer/light-emitting layer/electron-transport layer, hole-transport layer/light-emitting layer/electron-transport layer/electron-injection layer, or just the light-emitting layer. For the matrix color display, light-emitting layers made up of different materials are laminated for each pixel.

Figure 4A:
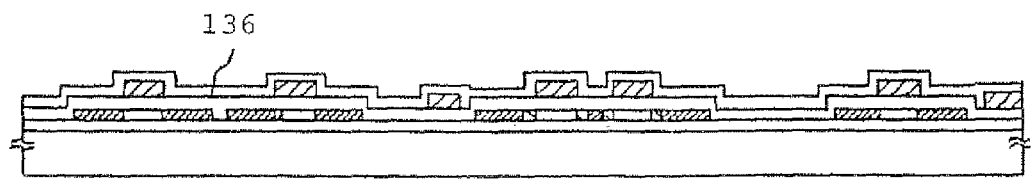
FIG. 4A to FIG. 4C show cross sectional views of manufacturing procedures for the conventional active matrix organic EL display devices.
Figure 4B:
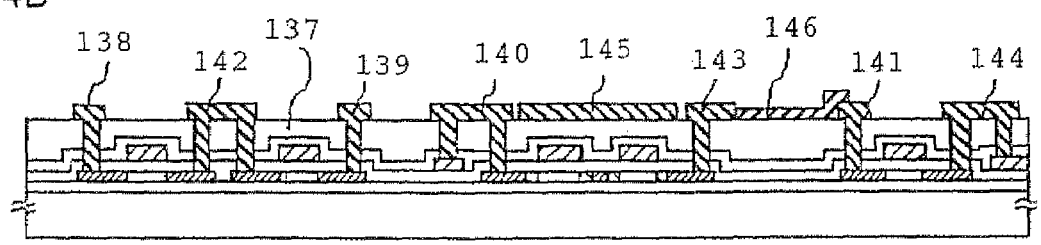
Figure 4C:
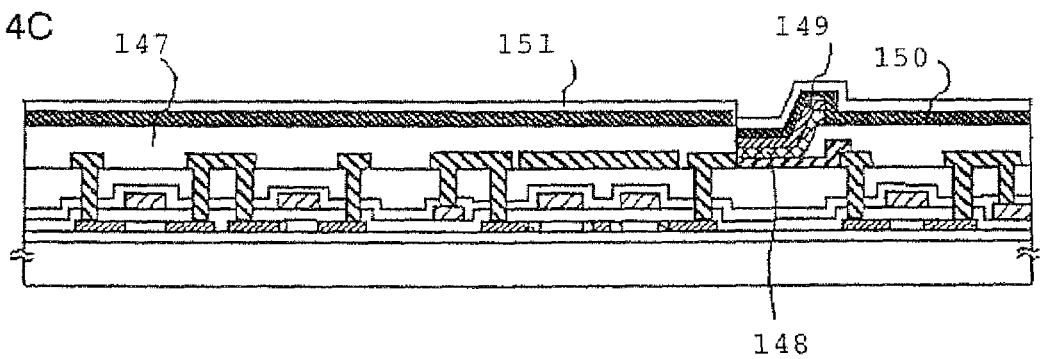
Figure 5:
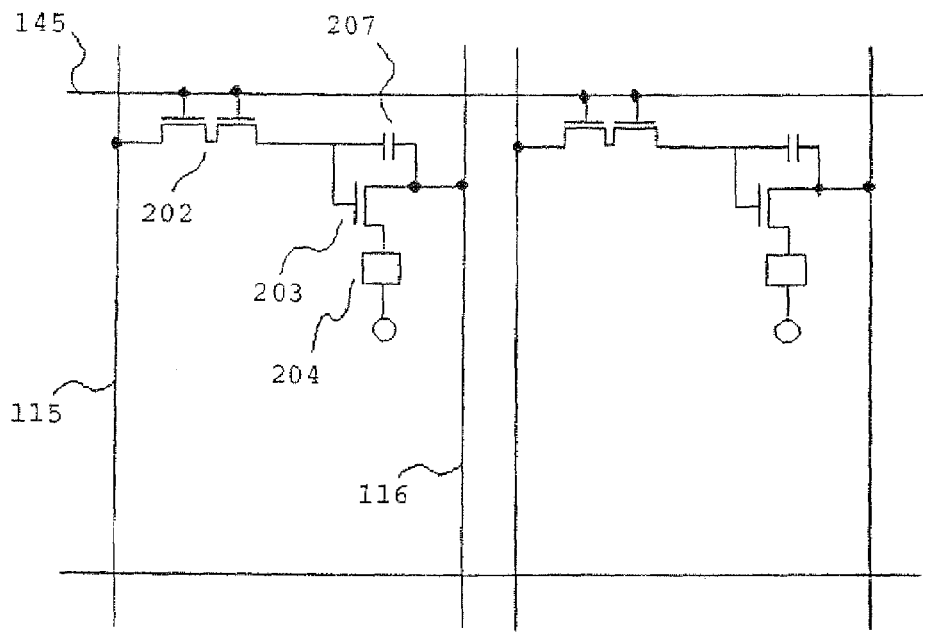
FIG. 5 shows an equivalent circuit diagram of the conventional active matrix organic EL display device.
Figure 6:
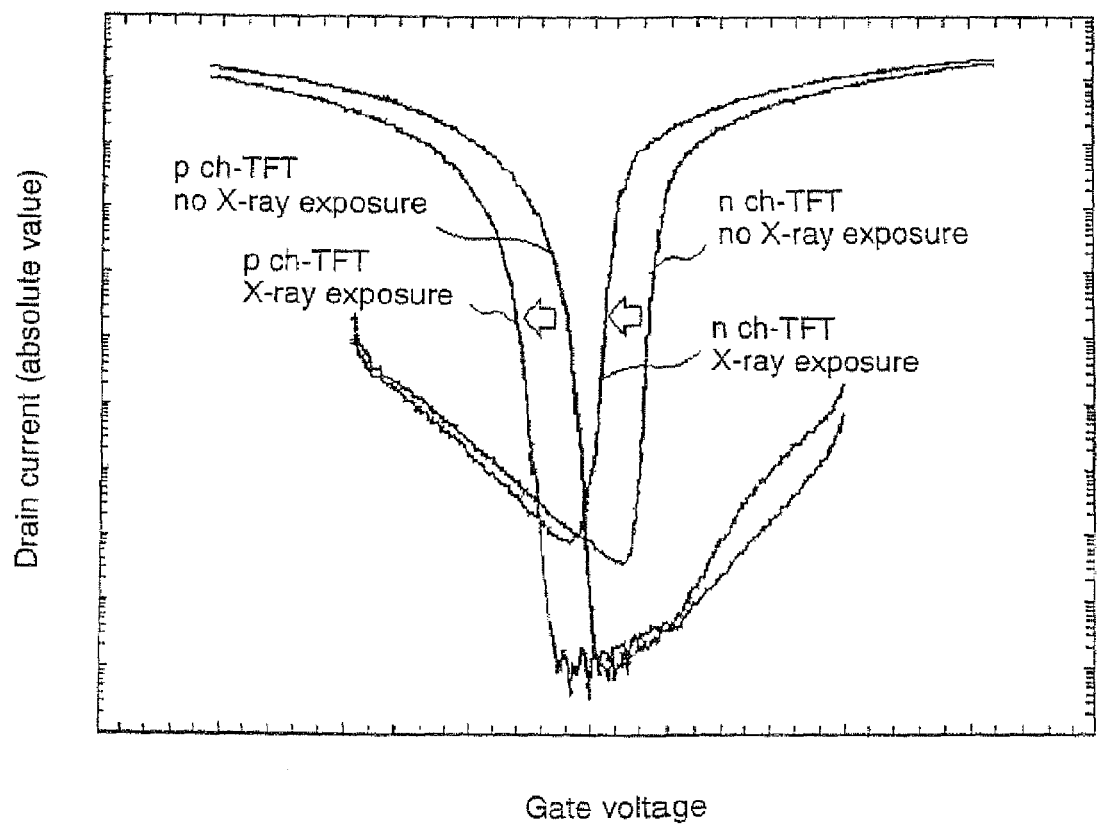
FIG. 6 illustrates the problem with the conventional active matrix organic EL display device, showing TFT gate voltage change due to the X-ray exposure.

Next, as shown in FIG. 9B, cathode electrode 7 made of Li or a Li compound and Al, for example, is formed with vapor deposition technology. In the conventional active matrix organic EL display device, cathode electrode 7 (cathode 4305 in FIG. 1, cathode 149 and protective electrode 150 in FIG. 4) is formed across the entire display region, so that problems arise in which the capacitance between cathode electrode 7 and the wiring line that connects row driver 1a and column driver 2a to pixel circuit 3 may delay signals and thus degrade the response characteristics, and X-ray during the electron beam vapor deposition may degrade the polysilicon TFT characteristics. In this example, to solve these problems at the same time, cathode electrode 7 is not formed across the entire display region, but is formed, as shown in FIG. 8, in a region apart from pixel circuit 3 including the polysilicon TFT and connection wiring at a predetermined distance (more specifically, a region apart from polysilicon-formed region 10a by L1). In doing so, pixel circuit 3 needs to be covered up so as not to form cathode electrode 7 over pixel circuit 3. Organic layer 14 is formed, however, under cathode electrode 7, so that the resist pattern cannot be used to selectively form cathode electrode 7. In this example, cathode electrode 7 is formed using a vapor deposition mask made from a metal plate such as Inver with wet etching technology. More specifically, on the substrate is positioned the vapor deposition mask, on which is deposited, for example, Li or a Li compound and Al (e.g., co-deposition of lithium 0.1 wt % aluminum) with a layer thickness of about 500 nm. In this way, the vapor deposition mask is used to form cathode electrode 7. The pattern of cathode electrode 7 is, for the configuration as shown in FIG. 8, a strip shape that includes EL element light-emitting region 5 and each contact hole 6 on cathode electrode wiring 4 for each row (each sub-pixel for the RGB primaries). Cathode electrode 7 is also electrically connected to cathode electrode wiring 4 via each contact hole 6. Then, the protective electrode and passivation layer are formed, if necessary, to complete the display substrate.

The above-described vapor deposition mask is used to protect pixel circuit 3 including the polysilicon TFTs and connection wirings to prevent capacitance between cathode electrode 7 and connection wirings, as well as to eliminate the possibility of the polysilicon TFT characteristic degradation due to X-ray, so that the vapor deposition process for forming cathode electrode 7 can use the electron beam vapor deposition source to provide a high quality vapor deposition layer, thereby making it possible to improve the organic EL element characteristic uniformity and mass production capability. It is preferable that the vapor deposition mask usually has a thickness of about 50 µm to maintain enough strength. Such a range of metal layer thickness can sufficiently absorb X-ray that emerges from the electron beam vapor deposition source.

In the active matrix organic EL display device formed as described above, any one pixel selected by the scanning line wiring and column-side wiring receives a voltage on its organic EL layer through anode 13 from power supply line 8 and through cathode electrode 7 from cathode electrode wiring 4. This allows any organic EL element to emit light at a desired brightness, thereby functioning as the display device.

The example in FIG. 8 shows cathode electrode 7 that is formed at the designed position, and the same distances (L1 and L2) are assumed between polysilicon-formed region 10a and cathode electrode 7. When manufacturing the actual display device, misalignment may occur between the cathode-electrode-formed region and polysilicon-formed region 10a on the glass substrate. The distances (L1 and L2) between polysilicon-formed region 10a and cathode electrode 7 thus need to be set to prevent misalignment from overlapping cathode electrode 7 and polysilicon-formed region 10a on a plane. In view of the current vapor deposition technology that may cause about 20 µm of the above-described misalignment, the distances (L1 and L2) are preferably set at 20 μm or more between polysilicon-formed region 10*a* and cathode electrode 7.

Example 2

Figure 10:
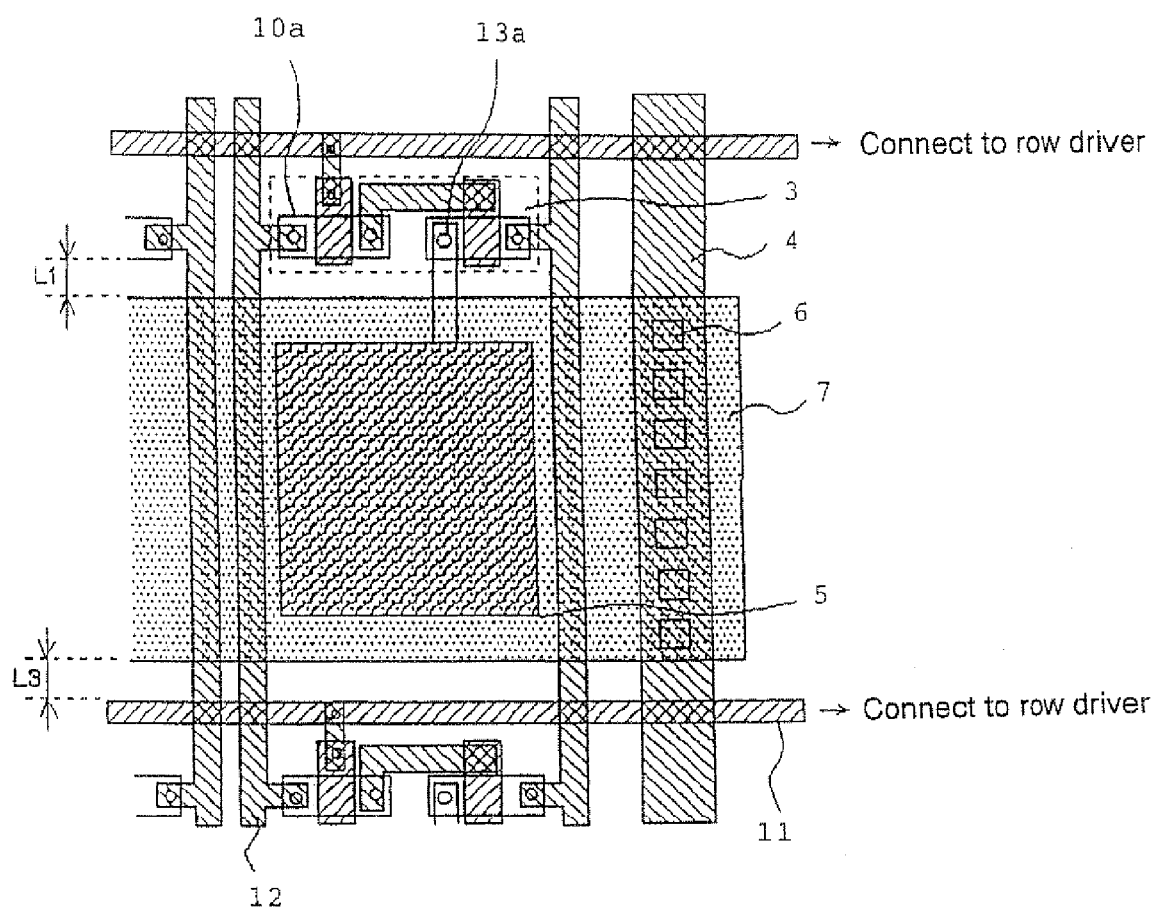
FIG. 10 shows a plan view of the structure of the active matrix organic EL display device according to the second example of the present invention.

The active matrix organic EL display device according to the second example of the present invention and manufacturing method thereof will now be described. FIG. 10 shows a plan view of the structure of the active matrix organic EL display device according to the second example of the present invention.

In the above-mentioned first example, cathode electrode 7 is formed so as not to overlap with pixel circuit 3. Cathode electrode 7 is preferably formed not to overlap with the wiring line as much as possible in order to further reduce capacitance between the wiring line and cathode electrode 7. In this example, cathode electrode 7 is formed in a region that does not overlap with either polysilicon-formed region 10*a* or the scanning line wiring (gate wiring 11).

The manufacturing method of the active matrix organic EL display device in this example, which is basically the same as with the above-mentioned first example, forms, for each row, cathode electrode 7 in a strip to include organic EL element light-emitting region 5 and contact holes 6 on cathode electrode wiring 4. Again, vapor deposition mask is used to form cathode electrode 7 of Li or a Li compound and Al with electron beam vapor deposition. The distance (L1) between polysilicon-formed region 10*a* and cathode electrode 7, and the distance (L3) between the scanning line wiring (gate wiring 11) and cathode electrode 7 are also preferably set at 20 μm or more in view of the misalignment.

Also in this example, the vapor deposition mask that protects the polysilicon TFT can prevent polysilicon TFT characteristic degradation during electron beam vapor deposition. The electron beam vapor deposition source can thus be used to provide a high quality vapor deposition layer that improves the organic EL element characteristic uniformity and mass production capability. In addition, since cathode electrode 7 is formed in a region the position of which is shifted from the scanning, line wiring (gate wiring 11) to the pixel side, it may create smaller organic EL light-emitting region 5 than in the first example, but can provide lower capacitance between cathode electrode 7 and the scanning line wiring, which makes possible a higher-speed operation.

In each example described above, organic EL light-emitting region 5 and pixel circuit 3 are arranged in the same manner in each pixel so that cathode electrode 7 is formed in a simple strip, but the present invention is not limited to such a shape. Cathode electrode 7 may be any shape that does not overlap with pixel circuit 3 including the polysilicon TFTs or the scanning line wirings such as gate line 11. The vapor deposition mask is, unlike the photomask, difficult to form with precise dimensions and difficult to align, so that it is preferably as simple a shape as possible. The layout of the vapor deposition mask is arranged so that the shape thereof becomes in view of the arrangement of pixel circuit 3 and arrangement direction of the pixels and the like.

The above-described active matrix organic EL display device according to the present invention and manufacturing method thereof can provide the following effects.

The first effect is that a high image quality display device without lines or non-uniformity on the screen can be achieved because the active matrix organic EL display device includes the control circuit including a polysilicon TFT that has less characteristic variation and performs according to specification. This is because the cathode electrode formed with the vapor deposition process is not formed over the polysilicon-TFT-formed region. That is, the vapor deposition mask protects the polysilicon TFTs during the vapor deposition process, so that the electron beam vapor deposition source, which may expose the substrate to X-ray, will not affect the various characteristics of the polysilicon TFT, thereby allowing for the display image quality that is derived from the design characteristics.

The second effect is that a higher frame frequency can be set to provide a display device that has less flicker and is adaptable to high-speed moving video pictures. This is because the cathode electrodes are not formed over the wiring lines which connect the row drivers or column drivers to the pixel circuits and the scanning line wirings in order to reduce the capacitance between these wiring lines and cathode electrode. Accordingly, a higher frame frequency can be set to provide a display device that has less flicker and is adaptable to high-speed moving video pictures. The reduced capacitance allows the driver to operate at lower power which can provide the display device with lower power consumption.

The invention claimed is:

1. A method for manufacturing an active matrix organic EL display device including a pixel that has an organic EL element and a polysilicon TFT for controlling said organic EL element which are disposed adjacent to each other, the pixel being formed in each of regions partitioned into a matrix by a plurality of intersecting data lines and scanning lines, comprising the steps of:
   forming on said substrate at least one cathode electrode wiring, then
   forming said polysilicon TFT on a substrate, and
   forming a cathode electrode of said organic EL element in a strip to be provided continuously over two or more adjacent pixels in a direction of said data line or scanning line, the position of which is opposite the side where said polysilicon TFT is connected, on said substrate with electron beam vapor deposition using a vapor deposition mask covering at least a region where said polysilicon TFT is formed,
   wherein said cathode electrode wiring extends in a direction of the narrow area of the cathode electrode, and in forming said cathode electrode in the strip, connecting each of said cathode electrodes formed in strips to said cathode electrode wiring through contact holes.

2. The method for manufacturing an active matrix organic EL display device according to claim 1, wherein said organic EL element includes a light-emitting region, further comprising the step of
   forming said cathode electrode to cover said light-emitting regions of said two or more adjacent pixels.

3. The method for manufacturing an active matrix organic EL display device according to claim 1, further comprising the step of forming said cathode electrode with material including lithium or a lithium compound and aluminum.

\* \* \* \* \*